United States Patent
Goldacker

(12) 
(10) Patent No.: US 6,418,331 B1
(45) Date of Patent: Jul. 9, 2002

(54) MULTI-CORE BSCCO HIGH-TEMPERATURE SUPERCONDUCTOR

(75) Inventor: Wilfried Goldacker, Heidelberg (DE)

(73) Assignee: Forschungszentrum Karlsruhe GmbH, Karlsruhe (DE)

( * ) Notice: Subject to any disclaimer, the term of this patent is extended or adjusted under 35 U.S.C. 154(b) by 47 days.

(21) Appl. No.: 09/653,981

(22) Filed: Sep. 1, 2000

Related U.S. Application Data

(63) Continuation-in-part of application No. PCT/EP99/00894, filed on Feb. 11, 1999.

(30) Foreign Application Priority Data

Mar. 3, 1998 (DE) .......................... 198 08 834

(51) Int. Cl.[7] .......................... H01B 12/10; H01L 39/12
(52) U.S. Cl. .................. 505/231; 505/238; 505/813; 174/125.1
(58) Field of Search ................... 505/231, 238, 505/431, 785, 813; 174/125.1

(56) References Cited

U.S. PATENT DOCUMENTS 5,340,799 A * 8/1994 Tauber et al. ................ 505/237

FOREIGN PATENT DOCUMENTS

WO    WO 96/28853    9/1996

OTHER PUBLICATIONS

Goldacker et al "Reduction of AC lossess applying novel resistive interfilamentary carbonate barriers . . . ", Physica C, 310(1–4) (1998), pp. 182–186. Abstract Only. Dec.*

Huang et al "Reducing AC lossess of Bi(2223) multifilamentary tapes by oxide barriers", Physica C, 294(1&2), 1998, 71–82. Abstract Only.*

Kovac et al "Electrical and Mechanical Properties of Bi–2223/Ag/barrier?Ag composite tapes", Supercond. Sci. Technol. 13(2000) 378–384. (Apr. 2000).*

* cited by examiner

Primary Examiner—Mark Kopec
(74) Attorney, Agent, or Firm—Klaus J. Bach

(57) ABSTRACT

In a multi-core-BSCCO high-temperature superconductor comprising a superconductor structure disposed in a silver enclosure, silver-enveloped superconductor filaments including a superconductive material having a metal component, and a resistive material layer disposed around the superconductor filaments and separating the superconductor filaments from each other, the resistive material layer consists of a carbonate having a metal component which is identical to a metal component included in the superconductor material.

5 Claims, 2 Drawing Sheets

MULTI-CORE BSCCO HIGH-TEMPERATURE SUPERCONDUCTOR

This is a cip application of international application PCT/EP99/00894 filed Feb. 11, 1999 and claiming the priority of German application 198 08 834.5 filed Mar. 03, 1998.

BACKGROUND OF THE INVENTION

The invention resides in a multi-core BSCCO high-temperature superconductor including silver coated superconductor filaments which are separated from each other by a resistive material layer forming a resistive barrier.

Prototypes of high temperature superconductors in wire or flat cable form are being tested as high power transmission cables, in transformers and in energy storage devices. The operating current of these components, which are part of the electrical power supply net, is an AC current which has certain consequences for the requirements for the current conductor. AC current operations result in specific AC current losses, hysteresis losses and eddy current losses in the normally conductive enveloping material of the superconductor and also in coupling losses between the superconductive cores.

In order to reduce eddy current losses and particularly coupling losses, the material disposed between the superconductive cores must have an as high as possible electric resistance. The necessary use of silver or silver alloys provides for only limited possibilities of increasing the resistance by using a special silver alloy. At most, a factor in one order of size has been found possible at an operating temperature of 77° K. And this has the disadvantages that the alloy components must consist partially of expensive noble metals such as palladium, which is a major disadvantage for a commercial economical utilization. If, on the other hand, for example, AgMg or AgCu are used, those alloys cause a disadvantageous chemical reaction with the superconductor by solid material diffusion.

Another essential aspect is the thermal stabilization of the conductor which is characterized by the pure silver coating and which is detrimentally affected by an increase of the material resistance.

Consequently, a conductor structure is needed which, on one hand, offers in contact with the super conductor core, the high stabilization effect of the silver and, on the other hand, increases the resistance between two superconductive cores. This is achieved by a more complex conductor structure in which the silver coating of the individual conductors of the multicore conductor are separated by a resistive material layer that is a so-called resistive barrier.

A solution is presented in "Reduction of AC Losses in Bi 2223 Tapes by Oxide Barriers", Y. Huang et al., which was accepted for publication in Proc. EUCAS Conference, Jun. 30–Jul. 3, 1997. Eindhoven, Netherlands. The barrier material introduced herein into the conductor structure is $BaZrO_4$, which is also installed as a powder coating during the bundling process (assembly) into the conductor structure. This oxideceramic structure is relatively hard, which obviously distorts somewhat the geometry of the conductor during deformation. The relatively low transport current densities indicate that the AC current losses of the conductors indicate a partial success of such a barrier in the effectiveness of increasing the electrical transverse resistance. Based on the dependency of the transverse resistance on the barrier layer thickness, it is shown that a substantial residual conductivity remains which cannot be eliminated.

It is therefore the object of the present invention to provide a multi-core high temperature superconductor with silver matrix which has low AC current losses, that is, which has a high electrical resistance between its superconductor filaments (transverse resistance) without any negative effects on other technical properties of the superconductor.

SUMMARY OF THE INVENTION

In a multi-core-BSCCO high-temperature superconductor comprising a superconductor structure disposed in a silver enclosure, silver-enveloped superconductor filaments including a superconductive material having a metal component, and a resistive material layer disposed around the superconductor filaments and separating the superconductor filaments from each other, the resistive material layer consists of a carbonate having a metal component which is identical to a metal component included in the superconductor material.

The barrier is subject to high temperature requirements: It must be chemically inert even during annealing of the superconductor at a temperature of 810–840° C. and for an annealing period of about 100 hours while it should be passive to a reaction with the surrounding silver and to diffusion through the silver so that the superconductor is not contaminated and the barrier material structure remains physically intact. Also, the barrier material needs to be permeable to oxygen at least to the degree as it is permeable for silver. It is furthermore a basic requirement that the barrier material can be deposited in the areas between the filaments when the individual conductors are bundled into an outer sleeve tube and remains effective after the re-forming procedure of the conductor while maintaining its geometry. Not many materials fulfill these conditions so that the selection is quite limited.

Electrically non-conductive strontium carbonate $SrCO_3$, also known under its mineral name strontianite has been selected as barrier material. This material is a component of the powder mixture of the pre-stage of the superconductor before it is subjected to the calcining annealing process wherein the carbonate is decomposed and the carbon generally escapes in the form of $CO_2$.

This barrier material has the following important advantages: The metallic component is also contained in the superconductor. If some of this barrier component diffuses into the superconductor, the superconductor will not essentially be affected thereby.

A necessary condition is also a high chemical stability with respect to decomposition at high temperatures. If this barrier component diffuses to the superconductor, the superconductor will not or only slightly be affected thereby.

The barrier material also needs to have a high chemical stability; even at high temperatures, it should not be subjected to decomposition. For a chemical equilibrium with respect to oxygen, the oxygen partial pressures are sufficient which develop at the barrier material because of the oxygen permeability of the silver. As a result, the annealing atmosphere of the superconductor contains 8% oxygen or more and the permeability of the silver with respect to oxygen ensures that the partial pressure for the stabilization at the barrier is present at the location of the barrier. The stability of the molecule prevents a release and the diffusion of the molecule components.

Other advantages are in the area of economics since the material is commercially available in the necessary purity and granularity and, because of its stability, it is considered to be free of health hazards and environmentally compatible.

This barrier material is basically suitable for both BSCCO superconductors presently in use, that is, the Bi(2212)/Ag wire (chemically (Bi or Pb)$_2$ Sr$_2$Ca$_1$Cu$_2$O$_x$ each with known +/−deviations of the components) or strand with the critical temperature of 85 K (used at T=4.2–about 30 K) and Bi(2223)/Ag-strand (chemically (Bi or Pb)$_2$ Sr$_2$CaCu$_2$O$_x$ each with known +/−deviations of the components) with a critical temperature of 110 K (used T=4.2 to 77° K.).

The use of a carbonate in contrast to a non-noble metal or an oxide is advantageous. The introduction of carbon into the conductor structure, which is in principle very detrimental, is neutralized by the extremely high stability of the material. It is however advantageous that the metallic component (Sr) of the barrier is identical to a component (Sr) of the superconductor so that no contamination of the superconductor by a foreign metal can occur.

The adaptation of the hardness of the barrier material to the silver is clearly better, since in contrast to the concentration of the material as presented in Huong et al., in several areas of the conductor cross-section, an advantageous tendency to a homogeneous distribution of the material can be observed. This tendency to form a continuous barrier during the conductor deformation procedure is an important basic condition for obtaining a minimum barrier thickness so that the superconductor content can be kept at the highest possible level. With a high superconductor content, a high current density for the conductor cross-section can be achieved so that the use of superconductive components instead of conventional normally conductive components becomes economical.

A second important observation resides in the sintering behavior of the barrier, by which the barrier is compacted and becomes less porous for the penetration by silver. This compacting effect causes a volume reduction, which can advantageously and effectively suppress the tendency of the superconductor to a volume increase during the reaction and which even contributes to an additional density increase. Already after the first annealing step, already more than 50% of the possible transport current is achieved without the otherwise necessary compaction by a rolling procedure. In this way, the technical and economical advantage is achieved that, in an optimized conductor with optimized annealing conditions, all reactions occur in a single annealing step. It is not necessary to employ two annealing steps with an intermittent deforming step as it has been necessary so far. In conductors with this new barrier material, the superconductor reacts at a speed comparable to that in a reference conductor without barrier. This is proof that the oxygen permeability of the superconductor coating is not essentially affected by the use of a carbonate barrier.

The chemical compatibility of the barrier is also documented by the fact that its chemical composition is unchanged after the annealing procedure as proven by observation through a Secondary Electron Microscope and by Energy Dispersive X-ray analysis (SEM/EDX).

The barrier material is commercially available in the form as used that is with the proper purity and granularity. It is a naturally occurring material, which is considered to be non-toxic and environmentally acceptable.

Below, the manufacturing procedure for a multi-core BSCOO high temperature superconductor, in this case a 19-core conductor, will be described briefly on the basis of the accompanying drawings.

DESCRIPTION OF A PREFERRED EMBODIMENT

Powder of the superconductor precursor is filled into a pipe of silver having an 8 mm outer diameter and a 6 mm inner diameter. After the tube is closed, it is deformed by hammer-forging until an outer diameter of 5 mm is obtained and subsequently by drawing until its outer diameter is 2.2 mm. The cross-section is reduced in 10% cross-section reduction steps. Then, the so formed wire is drawn through a hexagonal drawing die causing the wire to obtain a hexagonal cross-section with a wrench width of 1.64 mm. Finally, a strontionate powder slurry with ethanol or butanol is applied to sections of the hexagonal superconductor by immersing the superconductor wire into the powder slurry.

Figure 1:
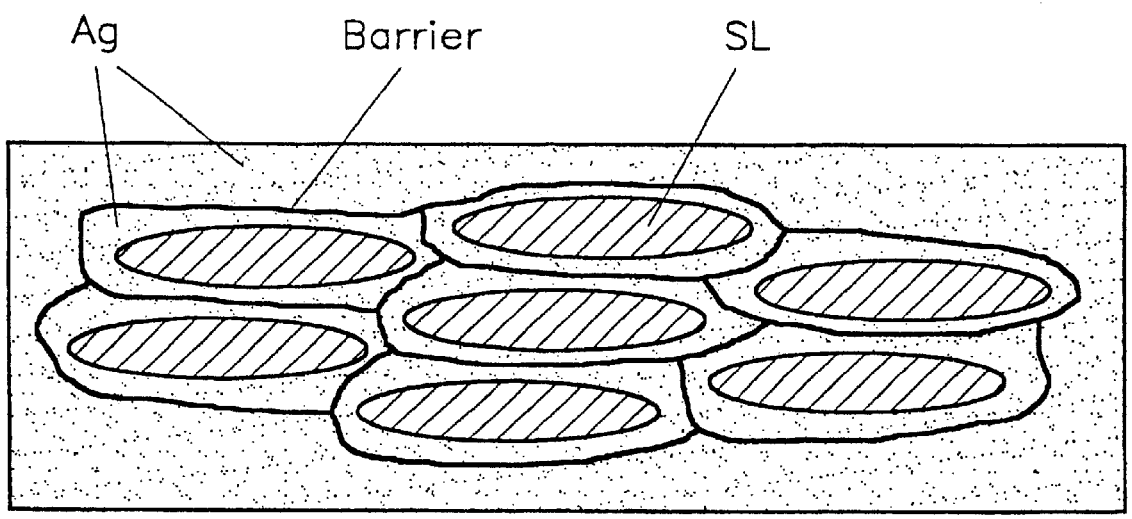
FIG. 1 shows the basic conductor structure.

Nineteen such superconductor sections coated with a strontionite paste are bundled and inserted into an outer tube of pure silver having a 12 mm outer diameter and a 10 mm inner diameter. For clarity reasons, FIG. 1 shows only 7 filaments.

In a heating step of 1 hour under vacuum at 200–300° C., the alcohol components are removed and the pipe is then closed and the superconductor diameter is then reduced to an outer diameter of 1.8 mm by circumferential hammer forging. Then the wire is rolled in a rolling mill to a strand of about 2.5 mm width and 0.22 mm thickness.

For the reaction of the superconductor, that is, for the conversion of the powder pre-stage of the superconductor cores into the desired Bi(2223) phase, the strand is annealed for 30 hours at a temperature of 818° C. in an annealing atmosphere of 8% oxygen/argon. After the annealing procedure, the strand cross-section should be unchanged. If the strand thickness is reduced by about 5–10% such reduction is the result of density sintering of the SrCO$_3$ barrier.

The transport current of the superconductor strand is determined by the 4-point method and a criterion for the critical current of 1 $\mu$V/cm to be 13. 7 A. With the cross-sections of the superconductor cores in the superconductor strand being determined from micrographs, the current density is 11 kA/cm$^2$. This value is about 50% of the current density of comparable standard conductors. It is a measure for the base quality of the conductor powder used. Considering that only one annealing step was performed, this value is high. An explanation for this effect can be found in the sintering of the barrier material, whereby the filament material is densified. As a result, the rolling step, which is normally needed for densifying the filament, and which includes a two- or three-step annealing procedure can be eliminated.

Figure 2:
FIG. 2 shows a micrograph of a polished section of a superconductor strand.

The constitution of the barrier before and after the annealing procedure is controlled by the energy dispersive X-ray analysis procedure (EDX). FIG. 2 shows a micrograph of the polished cross-section of a superconductor made in accordance with the invention which micrograph was taken with an optical microscope. The micrograph shows the resistive barriers in the form of closed lines around each core.

What is claimed is:

1. A multi-core BSCCO high temperature superconductor with a superconductor structure including, disposed in a silver enclosure, silver enveloped superconductor filaments including superconductor material having a metal component, said filaments being separated by a resistive material layer forming a barrier consisting of a carbonate having a metal component which is identical to a metal component of the superconductor material.

2. A multi-core BSCCO high temperature superconductor according to claim 1, wherein said filaments consist of individual core conductors which are bundled and surrounded by said barrier and enclosed in said silver enclosure to form said superconductor structure which is compressed and annealed.

3. A multi-core BSCCO high temperature superconductor according to claim 2, wherein said barrier is chemically inert during annealing of said superconductor.

4. A multi-core BSCCO high temperature superconductor according to claim 3, wherein said barrier has the same permeability for oxygen as silver.

5. A multi-core BSCCO high temperature superconductor according to claim 4, wherein said superconductor material consists of BSCCO and said resistive barrier consists of strontium carbonate ($SrCO_3$).

* * * * *